(12) United States Patent
Saki et al.

(10) Patent No.: US 11,066,741 B2
(45) Date of Patent: Jul. 20, 2021

(54) FILM FORMATION METHOD FOR MULTILAYER FILM

(71) Applicant: NITTO DENKO CORPORATION, Ibaraki (JP)

(72) Inventors: Satoru Saki, Ibaraki (JP); Shunsuke Shuto, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 27 days.

(21) Appl. No.: 16/306,711

(22) PCT Filed: Jun. 2, 2017

(86) PCT No.: PCT/JP2017/020580
§ 371 (c)(1),
(2) Date: Dec. 3, 2018

(87) PCT Pub. No.: WO2017/213040
PCT Pub. Date: Dec. 14, 2017

(65) Prior Publication Data
US 2019/0127844 A1  May 2, 2019

(30) Foreign Application Priority Data

Jun. 7, 2016 (JP) .............................. JP2016-113538

(51) Int. Cl.
| | |
|---|---|
| *C23C 14/54* | (2006.01) |
| *G01B 11/06* | (2006.01) |
| *G02B 1/115* | (2015.01) |
| *G02B 27/00* | (2006.01) |
| *G02B 5/08* | (2006.01) |
| *C23C 14/34* | (2006.01) |

(52) U.S. Cl.
CPC ............ *C23C 14/547* (2013.01); *C23C 14/34* (2013.01); *C23C 14/54* (2013.01); *G01B 11/06* (2013.01);
(Continued)

(58) Field of Classification Search
USPC .................................................... 204/192.13
See application file for complete search history.

(56) References Cited

U.S. PATENT DOCUMENTS

2007/0285643 A1*  12/2007  Wedowski .......... G03F 7/70958
355/67
2010/0221575 A1*  9/2010  Stull .................... C03C 17/3644
428/680
(Continued)

FOREIGN PATENT DOCUMENTS

| JP | H11-230719 A | 8/1999 |
|---|---|---|
| JP | 2006-71316 A | 3/2006 |

(Continued)

OTHER PUBLICATIONS

International Search Report dated Aug. 29, 2017, issued in counterpart International Application No. PCT/JP2017/020580 (1 page).
(Continued)

*Primary Examiner* — Brian K Talbot
(74) *Attorney, Agent, or Firm* — Westerman, Hattori, Daniels & Adrian LLP

(57) ABSTRACT

A method is disclosed to accurately estimate the thickness of each layer of a multilayer film. A first optical value difference between an actually measured optical value and a first theoretical optical value is obtained, and the first optical value difference is compared with a preset convergence condition. In a case where the first optical value difference does not satisfy the convergence condition, a second estimated thickness value of each layer expected to have an optical value difference smaller than the first optical value difference is set. A second optical value difference between an actually measured optical value and a second theoretical optical value is obtained, and the second optical value difference is compared with the convergence condition. Each step is repeated to obtain the estimated thickness value
(Continued)

of each layer in which the difference between the actually measured optical value and the theoretical optical value satisfies the convergence condition.

8 Claims, 1 Drawing Sheet

(52) U.S. Cl.
CPC ............ G02B 1/115 (2013.01); G02B 5/0816 (2013.01); G02B 27/0012 (2013.01)

(56) References Cited

U.S. PATENT DOCUMENTS

| | | | | |
|---|---|---|---|---|
| 2014/0186974 A1* | 7/2014 | Krijne | ................... | C23C 14/543 438/5 |
| 2014/0216924 A1* | 8/2014 | Lotz | ....................... | G02B 1/105 204/192.23 |
| 2015/0021168 A1* | 1/2015 | Lotz | ..................... | C23C 14/562 204/192.13 |
| 2016/0341544 A1* | 11/2016 | Foad | .................. | G01B 11/0625 |

FOREIGN PATENT DOCUMENTS

| | | | |
|---|---|---|---|
| JP | 2006-071316 A | | 3/2006 |
| JP | 2007071316 | * | 3/2006 |
| JP | 2010-2327 A | | 1/2010 |
| WO | 2011/046050 A1 | | 4/2011 |
| WO | 2015/007852 A1 | | 1/2015 |

OTHER PUBLICATIONS

Office Action dated Oct. 19, 2020, issued in counterpart Japanese Application No. 2016-113538 (8 pages; w/English translation).

* cited by examiner

FILM FORMATION METHOD FOR MULTILAYER FILM

BACKGROUND OF THE INVENTION

Field of the Invention

The present invention relates to a film formation method for a multilayer film, and in particular to a method of estimating the thickness of each layer of a multilayer film.

Description of the Related Art

The multilayer film is a film in which a plurality of films are laminated. Each film constituting the multilayer film is referred to as each layer. The multilayer film is manufactured by sequentially forming each layer on a substrate. When forming a multilayer film, it is not always possible to form each layer with a target thickness at all times. Therefore, film formation is performed while correcting the film formation parameters of each layer and adjusting the thickness of each layer. For example, Patent Document 1 (WO 2011/046050) discloses a method of adjusting the film formation parameters of each layer by utilizing the optical characteristics of the multilayer film having completed film formation.

In Patent Document 1, three layers of a first transparent layer (high refractive index layer), a second transparent layer (low refractive index layer), and a transparent conductive layer are sequentially formed on a long film. The spectral reflectance of the multilayer film having completed film formation is measured, and the film-forming condition of the second transparent layer is adjusted to reduce the difference from the target spectral reflectance. Thereby, the spectral reflectance of the multilayer film is varied by adjusting the thickness of the second transparent layer. Patent document 1 describes that the reason for adjusting the thickness of the second transparent layer is that thickness of the second transparent layer is the most easily adjusted.

As in Patent Document 1, if the multilayer film has three layers, it might be possible to reduce the difference between the actual measurement value and the target value of the spectral reflectance by changing the thickness of a specific one layer (second transparent layer). However, even in that case, if the cause of the difference between the actual measurement value and the target value of the spectral reflectance is a deviation of the thickness of the other two layers, the adjustment only means changing the thickness of the layer which does not need to be corrected. Furthermore, in a case where the number of layers of the multilayer film is four or more, it may become difficult to reduce the difference between the actual measurement value and the target value of the spectral reflectance merely by changing the thickness of a specific one layer. Therefore, it seems to be difficult to apply the method of Patent Document 1 to a multilayer film having a large number of layers (for example, four or more layers).

PRIOR ART DOCUMENT

Patent Document

Patent Document 1: WO 2011/046050

SUMMARY OF THE INVENTION

An object of the present invention is to accurately estimate the thickness of each layer from a formed multilayer film by using a non-destructive method.

The summary of the present invention is described as below.

In a first preferred aspect of the present invention, there is provided a film formation method for multilayer film which includes a process including the following steps:

a step of setting a target value (target thickness value) of the thickness of each layer of the multilayer film;

a step of obtaining a theoretical value (first theoretical optical value) of the optical characteristic when the thickness of each layer is the target thickness value;

a step of measuring an actual measurement value (actually measured optical value) of the optical characteristic of the formed multilayer film;

a step of setting the target thickness value as the first estimated thickness value of the thickness of each of the formed layers;

a step of obtaining a difference (first optical value difference) between the actually measured optical value and the first theoretical optical value, and comparing the first optical value difference with preset convergence conditions;

a step of setting a second estimated thickness value of the thickness of each layer that is expected to obtain an optical value difference smaller than the first optical value difference when the first optical value difference does not satisfy the convergence condition;

a step of obtaining a theoretical value (second theoretical optical value) of the optical characteristic when the thickness of each layer is the second estimated thickness value;

a step of obtaining a difference (second optical value difference) between the actually measured optical value and the second theoretical optical value, and comparing the second optical value difference with the convergence condition.

In the process included in the film formation method for a multilayer film of the present invention, the above-described steps are repeated to obtain an estimated thickness value of each layer in which the difference between the actually measured optical value and the theoretical optical value at each step satisfies the convergence condition.

In the film formation method for a multilayer film of the present invention, the estimated thickness value of each layer satisfying the convergence condition is set as the most reliable estimated thickness value (most probable estimated thickness value) of each of the formed layers.

In a second preferred aspect of the film formation method for multilayer film according to the present invention, the optical characteristic of the multilayer film is the spectral reflectance of the multilayer film.

In a third preferred aspect of the film formation method for multilayer film according to the present invention, the optical characteristic of the multilayer film is the hue of reflected light of the multilayer film.

In a fourth preferred aspect of the film formation method for multilayer film according to the present invention, it includes a step of calculating an optimum thickness of each layer with reference to the spectral reflectance or the hue of reflected light when estimating the thickness of each layer, and based on that calculation, determining the layer whose thickness is to be adjusted among the layers.

In a fifth preferred aspect of the film formation method for multilayer film according to the present invention, an estimated thickness value that can obtain an optical value difference smaller than the optical value difference at a certain step is obtained by using a curve fitting method.

In a sixth preferred aspect of the film formation method for multilayer film according to the present invention, the multilayer film is an optical multilayer film.

In a seventh preferred aspect of the film formation method for multilayer film according to the present invention, the multilayer film is formed by a sputtering method.

According to the present invention, a film formation method capable of accurately estimating the thickness of each layer from the formed multilayer film is realized. By accurately estimating the thickness of each layer, it becomes possible to accurately bring the thickness of each layer close to the target thickness value (the target thickness value is also called the designed thickness value). The present invention is particularly useful for a multilayer film having a large number of layers (for example, four or more layers).

DESCRIPTION OF THE PREFERRED EMBODIMENTS

[Multilayer Film]

Figure 1:
FIGS. 1(a) to 1(f) are schematic diagrams of a multilayer film according to the present invention.
Figure 1:
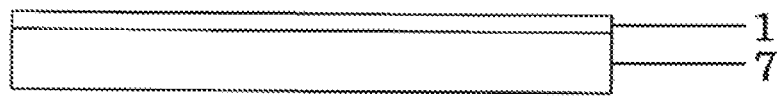
Figure 1:
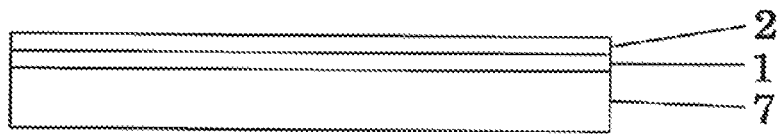
Figure 1:
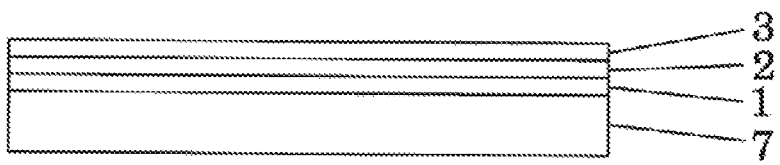
Figure 1:
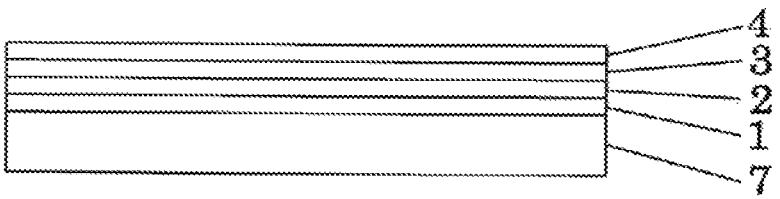
Figure 1:
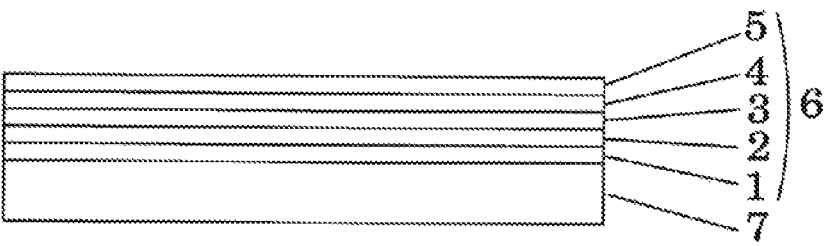

FIGS. 1(a) to 1(f) schematically show an example of a multilayer film according to the present invention. The number of layers of a multilayer film 6 is not limited, but FIGS. 1(a) to 1(f) show a case of five layers. FIG. 1(a) is a substrate 7 for laminating the multilayer film 6. Examples of the material of the substrate 7 include a glass plate, a glass film, a plastic plate, a plastic film, a metal coil, a metal plate and the like. The material, thickness, shape (plane, curved surface, sheet or long film, etc.), and the like of the substrate 7 are not limited.

FIG. 1(b) shows a state in which a first layer 1 is formed on the substrate 7. Examples of the first layer 1 include a transparent conductive film, a photocatalytic film, a gas barrier film, a light interference film, and the like, but the type of the film is not limited. Examples of the film formation method of the first layer 1 include a sputtering method, a vapor deposition method, a CVD method, and the like, but the film formation method is not limited.

FIG. 1(c) shows a state in which a second layer 2 is formed on the first layer 1. FIG. 1(d) shows a state in which a third layer 3 is formed on the second layer 2. FIG. 1(e) shows a state in which a fourth layer 4 is formed on the third layer 3. FIG. 1(f) shows a state in which a fifth layer 5 is formed on the fourth layer 4. The types of films and film formation methods of the second layer 2 to the fifth layer 5 are the same as those of the first layer 1.

Materials, functions, thicknesses, film formation methods, and the like of the first layer 1 to the fifth layer 5 are appropriately designed according to the use of the multilayer film 6 and the like. When the use of the multilayer film is optical, the multilayer film is called an optical multilayer film. Optical multilayer films are widely used for antireflection coatings and the like. A sputtering method, considering the variety of film materials that can be used, high hardness quality of film that can be obtained, and high accuracy of film thickness that can be obtained at large area, is often used as a film formation method for a multilayer film.

When forming a multilayer film, it is difficult to completely match the thickness of each layer with the target thickness value. For example, in the case of the sputtering method, the thickness of each layer is influenced by the partial pressure of sputtering gas, for example. However, even if the setting of the sputtering gas flowmeter is kept constant, the actual partial pressure of the sputtering gas fluctuates depending on temperature and pressure. The thickness of each layer changes in accordance with the fluctuation of the partial pressure of the sputtering gas. Such fluctuations inevitably occur not only in the partial pressure of the sputtering gas but also in many film formation parameters, such as the flow rate and partial pressure of the reactive gas, the cathode voltage, the target remaining amount, the distance between a film forming roll and the target, the temperature of the film forming roll, and the running speed of a substrate film. Therefore, even if the setting of the film formation parameters is kept constant, it is inevitable that the thickness of each layer changes over time.

[Thickness Estimation of Multilayer Film]

The thickness of each layer of the multilayer film can be known accurately by observing the cross section of the multilayer film with an electron microscope. However, particularly in the case of forming a multilayer film on a long film, it is not practical to cut out the sample frequently from the long film and observe the cross section. Therefore, the thickness of each layer of the multilayer film must be estimated by a non-destructive method. In the present invention, as a non-destructive method, the formed multilayer film is irradiated with light, and the thickness of each layer is estimated by using the optical value of the reflected light or the transmitted light. In the present invention, the optical value used for estimating the thickness of each layer is, for example, spectral reflectance, hue of reflected light, spectral transmittance, or hue of transmitted light.

[Film Thickness Estimation Method]

The film thickness estimation method of the present invention will now be described. In the film thickness estimation method of the present invention, first, an estimated thickness value of each layer is assumed, and a theoretical optical value corresponding to that is obtained by theoretical calculation. In the first theoretical calculation, the estimated thickness value of each layer is set as the target thickness value (designed thickness value). Next, the theoretical optical value and the actually measured optical value are compared. The step of comparing the theoretical optical value with the actually measured optical value is repeated n times (n=1, 2, 3, 4, ... ) by varying the estimated thickness value of each layer until the optical value difference (the difference between the actually measured optical value and the theoretical optical value) satisfies a preset convergence condition (for example, a standard value of the difference between the actual measurement value of the spectral reflectance and the theoretical value). The estimated thickness value of each layer when the optical value difference satisfies the preset convergence condition is set as the most reliable estimated thickness value ("most probable estimated thickness value") of each layer. In the following description, as an example, a case where the optical value difference satisfies the convergence condition after the step of comparing the theoretical optical value with the actually measured optical value is repeated three times (n=3) will be described.

(1) Depending on the purpose of the multilayer film, the target thickness value of each layer is set based on the theoretical calculation. For example, if the multilayer film is a transparent conductive film, a theoretical calculation is performed based on standard values of the light transmittance and the electric resistance value to set the target thickness value of each layer. If the multilayer film is an antireflection optical interference film, for example, the target thickness value of each layer is set so as to minimize the intensity of reflected light. The target thickness value of each layer is also called the designed thickness value of each layer.

(2) By theoretical calculations, theoretical optical values (for example, spectral reflectance or hue of reflected light) of the multilayer film when the thickness of each layer is the target thickness value are obtained. In the present invention, the theoretical optical value in a case where the thickness of each layer is the target thickness value is referred to as a "first theoretical optical value". In theoretical calculation, reflectance and transmittance of the substrate are taken into consideration as necessary.

(3) The actually formed multilayer film is irradiated with light and the optical value (for example, spectral reflectance or hue of reflected light) of the reflected light or the optical value (for example, spectral transmittance or hue of transmitted light) of the transmitted light is measured. In the present invention, an optical value obtained by measuring the actually formed multilayer film is referred to as an "actually measured optical value".

(4) Although the thickness of each layer of the actually formed multilayer film is unknown, in order to proceed with the film thickness estimation process, it is necessary to assume some kind of film thickness. Therefore, in the present invention, the initial estimated value of the thickness of each layer is set as the target thickness value (designed thickness value). In the present invention, the estimated value of the thickness of each layer for the first calculation is referred to as a "first estimated thickness value". Accordingly, the "first estimated thickness value" of each layer is the target thickness value. Since the first estimated thickness value of each layer is the same as the target thickness value, the theoretical optical value corresponding to this is the "first theoretical optical value".

(5) In the present invention, the difference between the actually measured optical value and the first theoretical optical value is referred to as a "first optical value difference". The first optical value difference is, in a case where the optical value is a spectral reflectance, the difference between the actual measurement value of the spectral reflectance and the theoretical value at the first time, whereas in a case where the optical value is the hue of the reflected light, the first optical value difference is the difference between the actual measurement value of the hue of the reflected light and the theoretical value at the first time.

(6) If the first optical value difference satisfies a preset convergence condition, the first estimated thickness value is set as the most reliable estimated thickness value of each layer, and the film thickness estimation process is terminated. In the present invention, the most reliable estimated thickness value of each layer is referred to as the "most probable estimated thickness value". Therefore, in this case, the first estimated thickness value becomes the most probable estimated thickness value. In a case where the first optical value difference does not satisfy the preset convergence condition, the film thickness estimation process is continued. In a case where the optical value is the spectral reflectance, the preset convergence condition is that the difference between the actual measurement value of the spectral reflectance and the theoretical value at the first time is equal to or smaller than a preset standard value. In a case where the optical value is the hue of the reflected light, the preset convergence condition is that the difference between the actual measurement value of the hue of the reflected light and the theoretical value at the first time is equal to or smaller than a preset standard value.

(7) In a case where the first optical value difference does not satisfy the preset convergence condition, a second estimated thickness value of the thickness of each layer, which is expected to obtain an optical value difference smaller than the first optical value difference, is set. In the present invention, the estimated value of the thickness of each layer for the second calculation is referred to as the "second estimated thickness value". The second estimated thickness value can be obtained by using, for example, a curve fitting method, based on the comparison result between the theoretical value at the first time and the actual measurement value.

(8) In a case where the thickness of each layer is the second estimated thickness value, a theoretical optical value (for example, spectral reflectance or hue of reflected light) is obtained by theoretical calculation. In the present invention, this theoretical optical value is referred to as a "second theoretical optical value".

(9) The difference between the actually measured optical value and the second theoretical optical value is obtained. In the present invention, the difference between the actually measured optical value and the second theoretical optical value is referred to as a "second optical value difference". The second optical value difference is the difference between the actual measurement value of the spectral reflectance and the theoretical value at the second time in a case where the optical value is the spectral reflectance, and is the difference between the actual measurement value of the hue of the reflected light and the theoretical value at the second time in a case where the optical value is the hue of the reflected light.

(10) If the second optical value difference satisfies a preset convergence condition, the second estimated thickness value is set as the most probable estimated thickness value of each layer, and the film thickness estimation process is terminated. If the second optical value difference does not satisfy the preset convergence condition, the film thickness estimation process is continued. The preset convergence condition is the same as in the case of the first optical value difference.

(11) In a case where the second optical value difference does not satisfy the preset convergence condition, a third estimated thickness value of the thickness of each layer, which is expected to obtain an optical value difference smaller than that of the second optical value difference, is set. In the present invention, the estimated value of the thickness of each layer at the third time is referred to as the "third estimated thickness value". The third estimated thickness value can be obtained by using, for example, a curve fitting method, based on the comparison result between the theoretical value at the second time and the actual measurement value.

(12) In a case where the thickness of each layer is the third estimated thickness value, a theoretical optical value (for example, spectral reflectance or hue of reflected light) is obtained by theoretical calculation. In the present invention, this theoretical optical value is referred to as a "third theoretical optical value".

(13) The difference between the actually measured optical value and the third theoretical optical value is obtained. In the present invention, the difference between the actually measured optical value and the third theoretical optical value is referred to as a "third optical value difference". The third optical value difference is the difference between the actual measurement value of the spectral reflectance and the theoretical value at the third time in a case where the optical value is spectral reflectance, and is the difference between the actual measurement value of the hue of the reflected light and the theoretical value at the third time in a case where the optical value is the hue of the reflected light.

(14) In a case where the third optical value difference satisfies a preset convergence condition, the third estimated thickness value is set as the most probable estimated thickness value of each layer, and the estimation process of film thickness ends. The preset convergence condition is the same as in the case of the first optical value difference. In a case where the third optical value difference does not satisfy the preset convergence condition, the estimation process of film thickness continues. Here, it is assumed that the third optical value difference satisfies a preset convergence condition. Therefore, the third estimated thickness value is set as the most probable estimated thickness value of each layer, and the estimation process of film thickness ends.

Actually, the above steps are repeated until the difference between the actually measured optical value at the n-th time (n=1, 2, 3, 4, 5, ...) and the n-th theoretical optical value (this is referred to as an "n-th optical value difference") satisfies the preset convergence condition, and finally the most probable estimated thickness value of each layer is obtained. The preset convergence condition is the same as in the case of the first optical value difference.

After the completion of the film thickness estimation, the film formation parameters are adjusted so as to minimize the difference between the most probable estimated thickness value of each layer and the target thickness value of each layer, and the thickness of each layer is optimized.

When estimating the thickness of each layer, it is also possible to include the step of calculating the optimum thickness of each layer with reference to the spectral reflectance or the hue of the reflected light and determining, based on the calculation, the layer whose thickness is to be adjusted among all the layers. As a result, it is possible to minimize the number of layers for which the film formation parameters are to be adjusted.

When the fluctuation of the thickness of each layer is to be expected also in the width direction due to the wide width of the multilayer film, the actually measured optical value is measured at a plurality of positions in the width direction, the most probable estimated thickness values of each layer are obtained at a plurality of positions in the width direction, and the film formation parameters are adjusted in a divided manner at a plurality of positions in the width direction.

INDUSTRIAL APPLICABILITY

There is no limitation on the usage of film formation method for a multilayer film of the present invention, but it is particularly preferred to be used for forming a multilayer film that has a large number of layers (for example, four or more layers) on a long film. The present invention is particularly useful since it is not easy to cut out the cross section measurement sample from the long film.

DESCRIPTION OF REFERENCE NUMERALS

1 First layer
2 Second layer
3 Third layer
4 Fourth layer
5 Fifth layer
6 Multilayer film
7 Substrate

What is claimed is:
1. A film formation method for a multilayer film, comprising:
a step of setting a target thickness value of each layer of the multilayer film;
a step of obtaining a first theoretical optical value of an optical characteristic when the thickness of each layer is the target thickness value;
a step of measuring an actually measured optical value of an optical characteristic of a formed multilayer film;
a step of setting the target thickness value as a first estimated thickness value of a thickness of each of the formed layers;
a step of obtaining a first optical value difference between the actually measured optical value and the first theoretical optical value, and comparing the first optical value difference with a preset convergence condition to determine whether the first optical value difference satisfies the preset convergence condition;
when the first optical value difference is determined to satisfy the preset convergence condition, a step of setting the first estimated thickness value of each layer is set as a most probable estimated thickness value of each of the formed layers,
when the first optical value difference is determined to not satisfy the preset convergence condition, a step of setting a second estimated thickness value of the thickness of each layer expected to obtain an optical value difference smaller than the first optical value difference;
a step of obtaining a second theoretical optical value of an optical characteristic when the thickness of each layer is the second estimated thickness value;
a step of obtaining a second optical value difference between the actually measured optical value and the second theoretical optical value, and comparing the second optical value difference with the preset convergence condition to determine whether the second optical value difference satisfies the preset convergence condition; and
repeating each of the steps until an estimated thickness value of each layer is obtained in which a difference between the actually measured optical value and the theoretical optical value at each step satisfies the preset convergence condition,
the estimated thickness value of each layer satisfying the preset convergence condition being set as a most probable estimated thickness value of each of the formed layers.

2. The film formation method for a multilayer film according to claim 1, wherein the optical characteristic of the multilayer film is a spectral reflectance of the multilayer film.

3. The film formation method for a multilayer film according to claim 1, wherein the optical characteristic of the multilayer film is a hue of reflected light of the multilayer film.

4. The film formation method for a multilayer film according to claim 2, further comprising, when estimating the thickness of each layer, a step of calculating an optimum thickness of each of the layers with reference to the spectral reflectance and determining, based on the calculation, a layer whose thickness is to be adjusted among the respective layers.

5. The film formation method for a multilayer film according to claim 3, further comprising, when estimating the thickness of each layer, a step of calculating an optimum thickness of each of the layers with reference to the hue of the reflected light and determining, based on the calculation, a layer whose thickness is to be adjusted among the layers.

6. The film formation method for a multilayer film according to claim 1, wherein an estimated thickness value for obtaining an optical value difference smaller than the optical value difference at a certain step is obtained by using a curve fitting method.

7. The film formation method for a multilayer film according to claim 1, wherein the multilayer film is an optical multilayer film.

8. The film formation method for a multilayer film according to claim 1, wherein the multilayer film is formed by a sputtering method.

* * * * *